United States Statutory Invention Registration [19]

[11] Reg. Number: H929

Kreta et al. [43] Published: Jun. 4, 1991

[54] LATCH FOR DETACHABLY SECURING ELECTRONIC CARDS ALONG ORTHOGONAL LOADING AXES

[75] Inventors: Stephen J. Kreta, Clarksburg, Md.; James J. Honn, Manassas, Va.

[73] Assignee: The Unites States of America as represented by the Secretary of the Navy, Washington, D.C.

[21] Appl. No.: 748,094

[22] Filed: Jun. 24, 1985

[51] Int. Cl.[5] ..... H01R 13/62

[52] U.S. Cl. ..... 439/325

[58] Field of Search ..... 339/17 M; 52/271; 403/364, 380, 381; 361/415

[56] References Cited

U.S. PATENT DOCUMENTS

| | | | |
|---|---|---|---|
| 2,562,939 | 8/1951 | Noe | 403/380 |
| 2,788,234 | 4/1957 | Doyle | 403/380 |
| 4,429,937 | 2/1984 | Stockmaster | 339/17 M |

*Primary Examiner*—Michael J. Carone
*Attorney, Agent, or Firm*—K. E. Walden; Frederick A. Wein

[57] ABSTRACT

The present invention relates to a latch for detachably securing electronics cards along orthogonal loading axes. A planar fixed gate is rigidly securable to an external supporting structure and is provided with at least one elongated protrusion extending above one of the planar surfaces. A planar movable gate is rigidly securable to an external electronics mountable structure wherein said movable gate is provided with at least one elongated groove on a planar surface. The planar fixed gate and the planar movable gate are abuttingly engageable to each other with the protrusion matingly fitted within the corresponding groove. The orientation of the protrusion and groove are orthogonal to an axis of a first loading force applicable to the moving gate. A fastener such as a threaded bolt rigidly maintains the planar surfaces of the fixed gate in engagement with the movable gate for rigid support along a second loading axis orthogonal to the first loading axis.

2 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

VERTICAL LATCH

VERTICAL LATCH

HORIZONTAL LATCH

LATCH FOR DETACHABLY SECURING ELECTRONIC CARDS ALONG ORTHOGONAL LOADING AXES

BACKGROUND OF THE INVENTION

The present invention relates to securing electronic modules such as printed circuit boards to racks and other assemblies, and more particularly, to securing such electronic cards rigidly against shock and vibration against a plurality of loading axes.

It is a persistent problem for securing and supporting electronic cards against multi-axis shock and vibration found in naval shipboard use. Additionally, these electronic cards must be detachable, particularly for repair purposes. Accordingly, it is desirable to provide a means for securing and supporting electronic cards against shock and vibration in high vibration environments along a plurality of orthogonal axes.

OBJECTS OF THE INVENTION

Accordingly, it is an object of the present invention to provide a latch for supporting electronic cards against multi-axes shock and vibration in high vibration environments.

Another object of the present invention is to provide a latch for mounting electronics cards wherein mating teeth and grooves fix the orientation of the major pieces along one orthogonal axis, and a fastener, such as a threaded bolt secures the pieces of the latch in abutting engagement with the male tooth within the groove along a second orthogonal loading axis.

Further objects and advantages of the present invention will become apparent as the following description proceeds and features of novelty characterizing the invention will be pointed out with particularity in the claims annexed to and forming a part of this specification.

SUMMARY OF THE INVENTION

Briefly, the present invention relates to a latch for detachably securing electronics cards along orthogonal loading axes. A planar fixed gate is rigidly securable to an external supporting structure and is provided with at least one elongated protrusion extending above one of the planar surfaces. A planar movable gate is rigidly securable to an external electronics mountable structure such as a card or printed circuit board wherein said movable gate is provided with at least one elongated groove on a planar surface of the movable gate. The planar fixed gate and the planar movable gate are abuttingly engagable to each other with the protrusion matingly fitted within the corresponding groove. The orientation of the protrusion and groove are orthogonal to an axis of a first loading force applicable to the moving gate. A fastener such as a threaded bolt rigidly maintains the planar surfaces of the fixed gate in engagement with the movable gate for rigid support along a second loading axis orthogonal to the first loading axes.

DESCRIPTION OF THE DRAWINGS

For better understanding of the present invention reference may be had to the accompanying drawings wherein.

DETAILED DESCRIPTION OF THE PREFERRED EMBODIMENT

Figure 1:
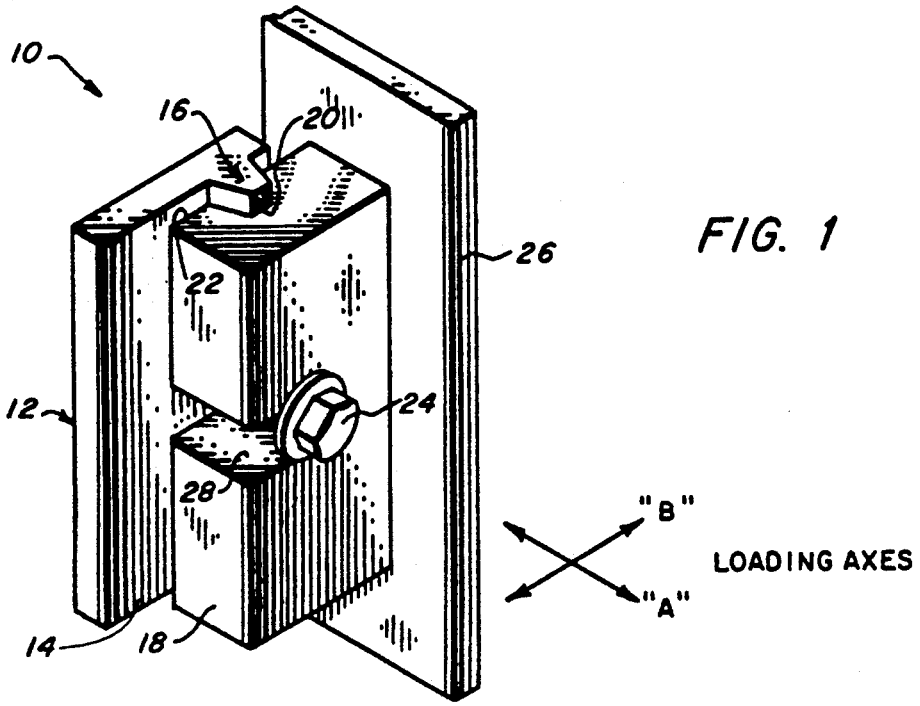
FIG. 1 is an isometric drawing of a latch of the present invention having a vertical tooth and groove.
Figure 2:
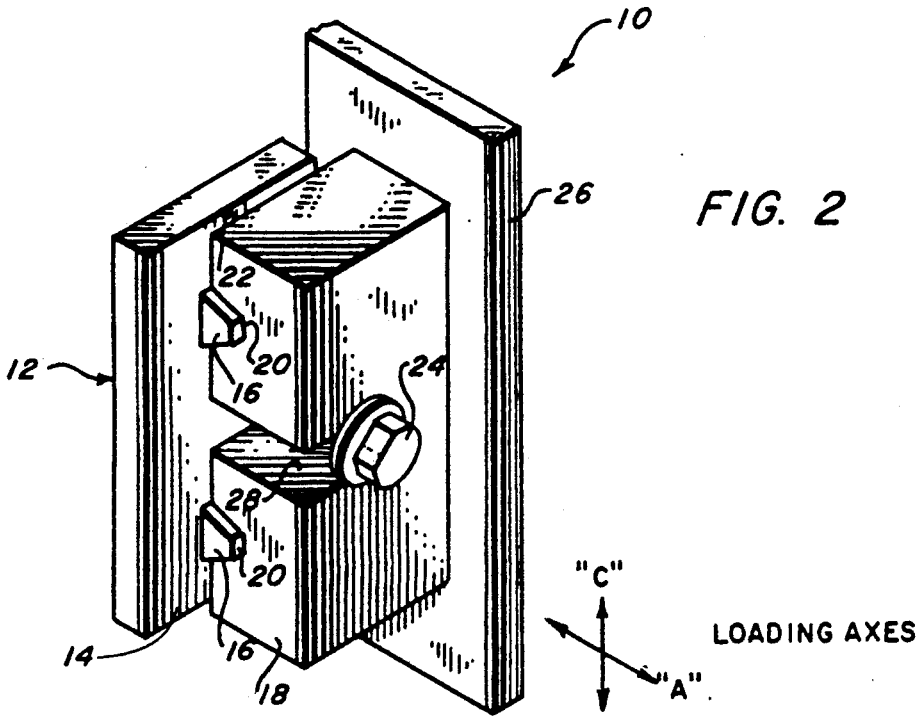
FIG. 2 is an isometric drawing of a latch of the present invention having a pair of horizontal teeth and grooves.

Referring now to the drawings wherein like reference numerals have been applied to like members there is shown in FIGS. 1 and 2 a detachable latch, generally designated 10, of the present invention. A fixed gate 12 is generally planar in form having a planar engagable surface 14 upon which teeth or protrusions 16 are provided. Fixed gate 12 is securable to a fixed object such as a cabinet (not shown) and becomes a rigid part of the cabinet. A generally planar movable gate 18 has provided with at least one elongated groove 20 on a planar surface 22, said groove 20 being matingly fittable with the corresponding protrusion 16 of fixed gate 12. When mounted, surfaces 22 and 14 are in abutting engagement with protrusions 16 matingly fitting into corresponding groove 20. A fastener 24, in the exemplary embodiment being threaded fastener threaded into gate 12 or secured by a nut on the other side (not shown), forces and maintains the fixed gate 12 in abutting engagement with the movable or detachable gate 18. A structure 26 desired to be mounted to the cabinet by gates 12, 18 is in turn secured to detachable gate 18 by means not shown.

With reference to FIG. 1, this exemplary latch has a vertical protrusion or tooth 16 and rigidly supports structure 26 along a loading axes shown by the arrow "B" orthogonal to protrusion 16 simultaneously with threaded fastener 24 supporting gate 18 in an orthogonal loading axis shown by arrow "A", perpendicular to the abutting planes 14, 22. In the exemplary embodiment threaded fastener 24 extends through an aperture 28 but it is within the contemplation of the present invention that other fasteners exerting forces along the same axis can be used.

Referring now to FIG. 2, the protrusions 16 are horizontal and support gate 18 to gate 12 against vertical loading as shown by arrow "C". Additionally, fastener 24 supports movable gate 18 to fixed gate 12 along axis "A" in the manner disclosed in connection with FIG. 1.

Thus, the movable gate 18 becomes rigidly mounted to the cabinet and relative motion between movable gate 18 and the mounting cabinet during shock impact shock or vibration is eliminated. The horizontal teeth 16 eliminate relative motion in the vertical direction and the vertical teeth 16 lock the gate 18 front to rear. The threaded fastener provides side to side lock according to arrow "A". The latches are self aligning and the teeth or protrusions 16 in the exemplary embodiment are tapered.

Thus there is disclosed a latch for detachably securing electronics cards along orthogonal loading axes for eliminating impact shock and/or vibration in high vibration environments. The latches are detachable from each other and self aligning due to the taper of the teeth.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent of the United States is:

1. A latch for detachably securing electronics cards along orthogonal loading axes comprising:

a planar gate fixed rigidly securable to an external supporting structure and provided with at least one elongated protrusion extending above one of a planar surface, a planar movable gate rigidly securable to an external electronics mountable structure, said movable gate having at least one elongated groove on a planar surface matingly fitting with corresponding protrusions of the fixed gate, the planar fixed gate and the planar movable gate being abuttingly engagable to each other with the protrusion matingly fitting into the corresponding groove, the longitudinal orientation of the protrusion and groove being orthogonal to the axis of a first loading force applicable to the moving gate, and fastening means for rigidly maintaining the planar fixed gate in abutting engagement with the movable gate along a second loading axis orthogonal to the first loading axis.

2. The latch of claim 1 wherein the fastening means is a threaded fastener extending through apertures through the thickness of the fixed and movable gates.

* * * * *